United States Patent [19]

Soma et al.

[11] Patent Number: 5,231,690
[45] Date of Patent: Jul. 27, 1993

[54] WAFER HEATERS FOR USE IN SEMICONDUCTOR-PRODUCING APPARATUS AND HEATING UNITS USING SUCH WAFER HEATERS

[75] Inventors: Takao Soma, Nishikamo; Ryusuke Ushikoshi, Handa City; Kazuhiro Nobori, Haguri, all of Japan

[73] Assignee: NGK Insulators, Ltd., Japan

[21] Appl. No.: 668,161

[22] Filed: Mar. 12, 1991

[30] Foreign Application Priority Data

Mar. 12, 1990 [JP] Japan .................. 2-60505
Jun. 29, 1990 [JP] Japan .................. 2-173722
Jul. 20, 1990 [JP] Japan .................. 2-190699

[51] Int. Cl.$^5$ ............... H01L 21/205; F26B 19/00
[52] U.S. Cl. ................... 392/416; 219/409; 219/385; 118/725
[58] Field of Search ............... 392/416, 388, 389; 219/402, 409, 459, 457, 464, 521, 385; 118/725, 724

[56] References Cited

U.S. PATENT DOCUMENTS

| | | | |
|---|---|---|---|
| 2,961,523 | 11/1960 | Hanson et al. ............... | 219/19 |
| 3,187,162 | 6/1965 | Hojo et al. ............... | 219/388 |
| 3,220,380 | 11/1965 | Schaarschmidt ............... | 219/385 |
| 3,381,114 | 4/1968 | Nakanuma ............... | 219/385 |
| 3,386,853 | 6/1968 | Oberg et al. ............... | 118/726 |
| 3,391,270 | 7/1968 | Harris et al. ............... | 219/385 |
| 3,465,204 | 9/1969 | Michalski ............... | 315/363 |
| 3,505,499 | 4/1970 | Walther ............... | 219/385 |
| 3,786,233 | 1/1974 | Bumpus et al. ............... | 219/343 |
| 3,894,343 | 7/1975 | Pray et al. ............... | 34/4 |
| 4,032,817 | 6/1977 | Richmond ............... | 315/149 |
| 4,169,007 | 9/1979 | Pray ............... | 156/380 |
| 4,639,712 | 1/1987 | Kobayashi et al. ............... | 338/238 |
| 4,665,627 | 5/1987 | Wilde et al. ............... | 34/4 |
| 4,692,420 | 9/1987 | Oda et al. ............... | 501/97 |
| 4,773,167 | 9/1988 | Jacobi, Jr. ............... | 34/4 |
| 4,778,559 | 10/1988 | McNeilly ............... | 219/399 |
| 4,783,908 | 11/1988 | Pabst ............... | 34/4 |
| 5,063,031 | 11/1991 | Sato ............... | 118/725 |
| 5,105,066 | 4/1992 | Houdy et al. ............... | 219/385 |
| 5,126,533 | 6/1992 | Newman et al. ............... | 219/200 |

FOREIGN PATENT DOCUMENTS

| | | |
|---|---|---|
| 267451 | 5/1988 | European Pat. Off. . |
| 376387 | 7/1990 | European Pat. Off. . |
| 3914699 | 11/1989 | Fed. Rep. of Germany . |
| 60-106968 | 6/1985 | Japan .................. 118/726 |
| 63-196033 | 8/1988 | Japan . |
| 63-278322 | 11/1988 | Japan . |
| 2057761 | 4/1981 | United Kingdom . |

*Primary Examiner*—Bruce A. Reynolds
*Assistant Examiner*—John A. Jeffery
*Attorney, Agent, or Firm*—Parkhurst, Wendel & Rossi

[57] ABSTRACT

A wafer heater for use in a semiconductor producing apparatus or the like. The heater includes a discoidal substrate made of a dense ceramic, and a resistance heating element buried in the substrate. The surface of the substrate other than that surface upon which a wafer is to be placed for heating is a flat surface. A heating unit is also disclosed, which includes such a heater in a chamber for the semiconductor-producing apparatus. The heating unit further involves a hollow sheath of which inner pressure is not substantially varied even when the pressure inside the chamber changes and is joined to the heater, and a thermocouple inserted into the hollow sheath. Further, a projecting support portion may be provided on the surface of the substrate other than that surface upon which the wafer is to be placed for heating, and lead wires connected to the resistance heating element, wherein when the heater is placed in the chamber, the projecting support portion forms a gas-tight seal between the chamber, and the lead wires are taken out from the chamber such that the lead wires may not substantially be exposed to an inner space inside the chamber.

13 Claims, 5 Drawing Sheets

FIG_1
PRIOR ART

FIG_2

FIG_3A

FIG_3B

FIG_4

FIG_5

FIG_6

FIG_7

WAFER HEATERS FOR USE IN SEMICONDUCTOR-PRODUCING APPARATUS AND HEATING UNITS USING SUCH WAFER HEATERS

BACKGROUND OF THE INVENTION (1) Field of the Invention

The present invention relates to wafer heaters for use in semiconductor-producing apparatus, heating units using such wafer heaters, and processes for producing such heaters. The heating unit is to be used for a pressure-reduced CVD apparatus or a photoetching apparatuses for the production of films on surfaces of silicon wafers in the semiconductor industry.

(2) Related Art Statement

In the CVD necessitating super cleanness, a corrosive gas such as a chlorine based gas or a fluorine based gas is used as a depositing gas, an etching gas or a cleaning gas. Thus, when a conventional heater in which the surface of a resistance heating element is coated with a metal such as stainless steel or Inconel is used as a heater for heating a wafer in such a state that it is brought into contact with this corrosive gas, particles of a chloride, a fluoride, an oxide or the like having a particle diameter of few to several $\mu$m are unfavorably formed on the surface of a heater upon exposure to the corrosive gas.

Figure 1:
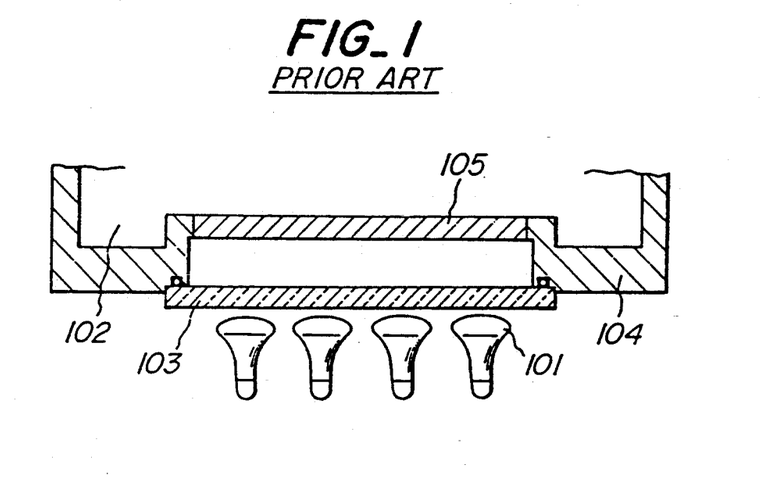
FIG. 1 is a sectional view of the conventional heater.

Under the circumstances, an indirectly heating type wafer heater shown in FIG. 1 has been developed. In this heater, infrared lamps 101 are disposed outside a chamber 102 which is exposed to a depositing gas or the like, an infrared ray-permeable window 103 is provided in an outer wall 104 of the chamber, and a wafer placed on an upper surface of a heating member 105 of a corrosion resistive material such as graphite is heated by irradiating infrared rays upon the heating member 5. As compared with a directly heating type, the indirectly heating type heater has greater heat loss, and requires longer time for raising the temperature. Further, transmission of the infrared rays is gradually interrupted with attachment of a CVD film onto the infrared ray-permeable window 103, so that heat is absorbed by the infrared ray-permeable window 103 to overheat the window.

SUMMARY OF THE INVENTION

A first aspect of the present invention has been accomplished to solve the above-mentioned problems possessed by the above-mentioned prior art, and to provide a wafer heater for use in a semiconductor producing apparatus, such as a CVD apparatus, requiring super cleanness, which heater is free from production of particles even when exposed to a depositing gas or the like inside the semiconductor-producing apparatus and can rapidly heat wafers at high efficiency.

The above-mentioned solution has been made by a wafer heater for the semiconductor-producing apparatus, characterized in that a resistance heating element is buried inside a discoidal substrate made of a dense ceramic material, and that surface of the substrate upon which a wafer is to be placed is made flat.

It is preferable that a ceramic film is formed, by plasma CVD or thermal CVD, on that surface of the ceramic which contacts the gas. It is also preferable that the substrate is made of $Si_3N_4$.

In general, the above ceramic heater is assembled into a chamber for the semiconductor-producing apparatus. In order to measure the temperature of the ceramic heater placed in the case provided in the chamber ("casing with heater" being hereinafter referred to briefly as "heating unit"), a thermocouple is attached to the heater. In such a case, the present inventors have noticed that certain problems existed.

In such a heating unit, no great problem occurs when the heating unit is used under ordinary constant pressure. However, when the interior of the chamber and the heater casing undergoes pressure changes, there is the possibility that the thermocouple erroneously operates, and the temperature of the heater cannot be accurately controlled.

In view of this, it is a second aspect of the present invention to solve this problem possessed by the prior art, and to provide a heating unit for accurately measuring and accurately controlling the temperature of the ceramic heater even under variations in pressure of the gas.

The second aspect of the present invention has been accomplished based on the following recognition.

That is, the present inventors have examined causes for erroneous operation of the above-mentioned thermocouple, and consequently, they found out that gas molecules around the thermocouple behave as a viscous stream in a vacuum state from atmospheric pressure to 1 torr, whereas when the vacuum degree is higher, the gas molecules behave as a molecular stream. They further found out that with this, since the way of the heat transmission around the thermocouple greatly changes to make accurate temperature measurement impossible. Further, they found out that errors in the measurement of the temperature occur due to great variations in pressure even in the viscous stream range.

When an object of which temperature is to be measured is metallic, it is generally possible to attach the thermocouple to the object by direct brazing or welding. However, in the case that the object of which temperature is to be measured is an inorganic substrate as mentioned above, it is impossible to directly attach the thermocouple to the object. For this reason, it is a common practice to merely mechanically press the thermocouple into a hole formed in the inorganic substrate or the heater. In such a case, the inventors found out that the heat transfer between the inorganic substrate or the heater and the thermocouple depends upon the gas varying its pressure.

The second aspect of the present invention has been accomplished on this knowledge, and is characterized in that a tip of a hollow sheath is joined to a heater placed inside a chamber undergoing changes in pressure, the interior of the hollow sheath undergoes substantially no changes in pressure even if the pressure inside the chamber varies, and a thermocouple is inserted into the hollow sheath.

In the present invention, the hollow sheath is a metallic sheath into which a thermocouple is to be inserted. The term "join" used means a case where the tip of the thermocouple is joined to the surface of the heater and a case where the former is buried into the latter. The heater involves an inorganic substrate and a resistor or heating element buried in the substrate.

Since the joining between the tip of the hollow sheath and the heater is required to have thermal shock resistance in a service temperature range, gas tightness is desirably assured between the opposed surfaces of the hollow sheath and a part of the heater. For this reason, a glass adhesive or an inorganic adhesive is preferred as a joining medium, and glass is particularly preferred due to its good gas tightness. It is preferable that the glass has a coefficient of thermal expansion lying between those of the substrate and the sheath material from the standpoint of durability against temperature changes.

The term "heater" used in the second aspect of the present invention includes not only the heater itself but also a combination of the heater and a susceptor placed on the heater and made of an inorganic material. The inorganic substrate of the heater and this inorganic material of which temperature is to be measured may be appropriately selected from the group consisting of ceramics such as alumina, silicon nitride, sialon and silicon carbide or their composite materials containing silicon, gallium or arsenic, or inorganic compounds thereof. The susceptor may be made of graphite. As the substrate of the heater, silicon nitride, sialon or aluminum nitride is particularly used, and silicon nitride and sialon are preferred. The term "heater" may be interpreted to comprise the heater itself and a constituent member or members of the casing.

With respect to the above-mentioned heating unit, the present inventors found out that there was another problem. That is, the above discoidal heater may be fixed to the chamber through a casing, i.e., a supporting member of graphite in the heating unit (It may be that the hollow sheath is fitted to that wafer stage of the heater upon which the wafer is just placed). Although the present inventors found out that this heating unit is an extremely excellent device for sweeping out the above-mentioned problems possessed by the metallic heater and the indirectly heating type infrared lamp heating unit, it is necessary to seal lead wires and the thermocouple in the semiconductor-producing apparatus using the corrosive gas.

A third aspect of the present invention is to provide a semiconductor wafer heater for use in the semiconductor-producing apparatus, which heater can prevent contamination as in the case of the conventional metallic heater as well as poor heat efficiency and attachment of the film onto the infrared ray-permeable window as in the case of the indirectly heating type heater, and can also prevent corrosion of the lead wires, and discharging and leaking of current among the lead wires, and the chamber body.

The third aspect of the present invention relates to a semiconductor wafer heater comprising a heating portion adapted to be located in a chamber for a semiconductor-producing apparatus, said heating portion being composed of a ceramic material and having a resistance heating element buried therein and a wafer-heating surface at one surface, a projecting support portion provided on a surface of the heating portion other than the wafer-heating surface and adapted to form a gastight seal between the projecting support portion and the chamber, and lead wires connected to said resistance heating element, at least one of said lead wires being taken out from said chamber without substantially being exposed to an inner space of said chamber.

In the present invention, it may be that one of the ends of rigid electrodes are buried in the substrate and connected to opposite ends of the heating element, while the other ends of the electrodes not buried are connected to lead wires for supplying electric power to the heating element.

A process for producing the heater according to the third aspect of the present invention is a fourth aspect of the present invention.

That is, a variation of the fourth aspect of the present invention relates to a process for producing a semiconductor wafer heater through integrally shaping a heating portion and a projecting support portion as mentioned above and simultaneously sintering the shaped body by hot isostatic pressing.

Another variation of the fourth aspect of the present invention relates to a process for producing the semiconductor wafer heater by separately shaping a green heating portion and a green projecting support portion, forming a joined body by joining these shaped bodies, and forming the heating portion and the projecting support portion by sintering the joined body.

A further variation of the fourth aspect of the present invention relates to a process for separately producing a heating portion and a projecting support portion by sintering, and integrating the heating portion and the projecting support portion by glass bonding or by diffusion bonding.

These and other objects, features and advantages of the invention will be appreciated upon reading the following description of the invention when taken in conjunction with the attached drawings, with the understanding that some modifications variations and changes of the same could be made by the skilled person in the art to which the invention pertains, without departing from the spirit of the invention or the scope of claims appended hereto.

BRIEF DESCRIPTION OF THE DRAWINGS

For a better understanding of the invention, reference is made to the attached drawings, wherein.

DETAILED DESCRIPTION OF THE INVENTION

In the following, the first aspect of the present invention will be explained with reference to FIGS. 2, 3A and 3B.

Figure 2:
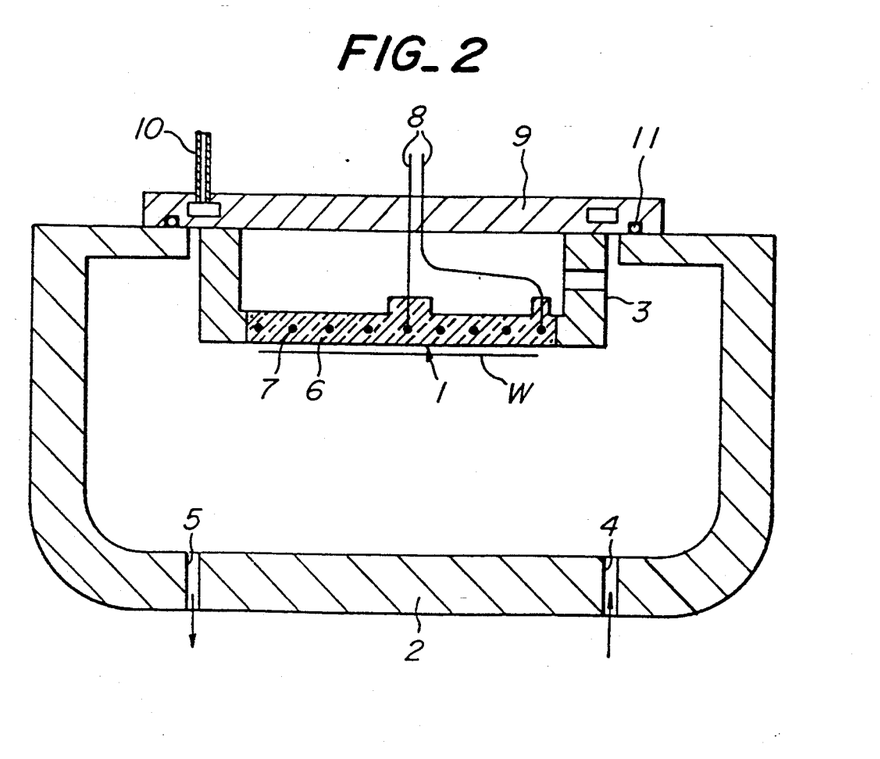
FIG. 2 is a sectional view of an embodiment of a heating unit including a heater according to the first aspect of the present invention.
Figure 3A:
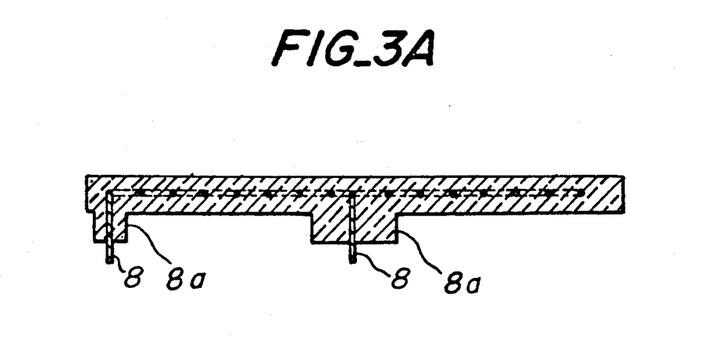
FIG. 3A and 3B are a sectional view of FIG. 2 and a plane view of the heater, respectively.
Figure 3B:
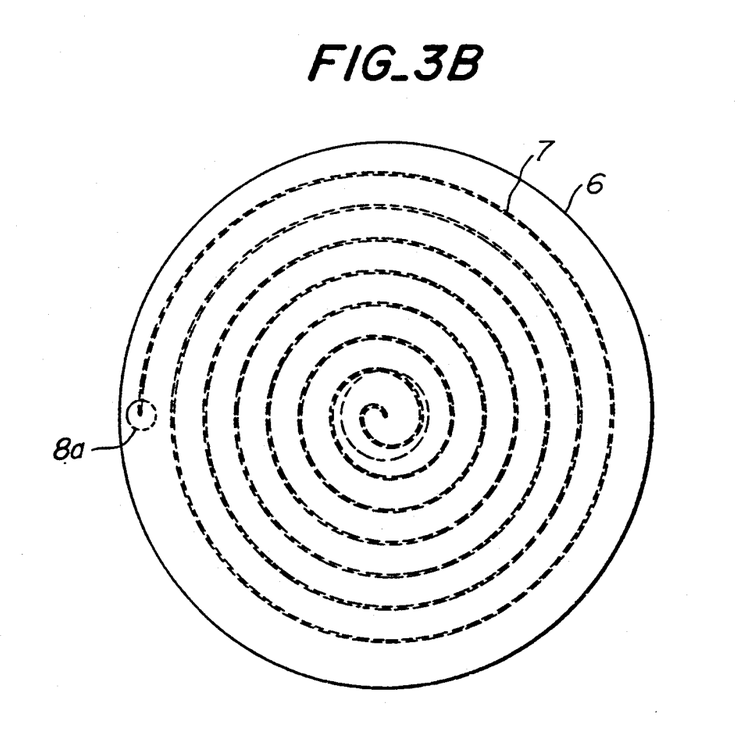

FIG. 2 is a sectional view of a wafer heater 1 according to the first aspect of the present invention, which is attached to a chamber 2 for a CVD apparatus to produce semiconductors. In FIG. 2, the heater 1 is attached to the chamber 2 through an inner casing 3. The heater 1 is designed to have, for example, a size of 4 to 8 inches to place a wafer thereon.

Into the interior of the chamber 2 is fed a gas for effecting thermal CVD through a gas feed hole 4, while air inside the chamber 2 is discharged by a vacuum pump (not shown) through a suction hole 5.

The wafer heater 1 is constituted by burying a resistance heating element 7, of such as tungsten, inside a discoidal substrate 6 made of a dense and gas-tight ceramic material, for example, silicon nitride, in a spiral form. Power is applied to the wafer heater 1 through lead wires 8, 8 at a center and a peripheral portion of the substrate 6 from the exterior to heat the heater 1 to a temperature up to, for example, about 1,100° C. A reference numeral 9 is a flange provided with a water-cooling jacket 10 and adapted for covering an upper face of the inner casing 3. Sealing is effected with an O-ring 11 between an upper peripheral wall of the chamber 2 and the flange to form a ceiling of the chamber 2.

The material of the substrate 6 needs to be dense to prevent absorption of the depositing gas thereinto, and preferably has a water absorption factor of not more than 0.01%. Further, the material is required to have thermal shock resistance to withstand heating-cooling cycles between ordinary temperature and 1,100° C., although no mechanical stress is applied thereto. In view of this, it is most preferable to use $Si_3N_4$ having high strength at high temperatures.

Since a wafer W is placed on the lower surface of the heater 1 directly or indirectly by means of pins (not shown), it is necessary that the shape of the heater is circular, which can readily attain uniform heating, and that the surface of the heater upon which the wafer W is to be placed is flat. In particular, when the wafer W is to be placed on the heater directly, the flatness needs to be not more than 500 $\mu$m so that the depositing gas may be prevented from entering a rear face of the wafer W contacting the substrate 6. In order to obtain a dense substrate 6, it is preferable to sinter a green substrate by hot press or HIP. When greater heat conductivity is to be obtained by flowing gas between the wafer and the surface of the heater, recesses having a depth not greater that the distance of free movement of gas molecules may be provided in a part or an entire part of the heater surface.

Even when $Si_3N_4$ having a high purity is used, yttria, magnesia, alumina, ytteribium oxide or the like is mixed as sintering aid into $Si_3N_4$, and it happens that sodium or the like which needs to be particularly prevented from entering the semiconductor producing apparatus is detected in an order of ppm. Therefore, it is preferable that a ceramic film made of such as SiC or $Si_3N_4$ is formed onto the gas-contacting surface of the substrate 6 by the plasma CVD or the thermal CVD. By so doing, discharging of sodium or the like can be prevented. As the sintering aid, it is preferable to use no magnesia which belongs to the same alkaline earth metal group. Yttria, alumina, or yttrium base material is preferred as the sintering aid. Since $Si_3N_4$ has durability at high temperatures, highest durability can be obtained when the film is formed as a crystalline coating on the substrate by thermal CVD at not less than 1,000° C. However, a similar effect can be expected when an amorphous coating is effected by plasma CVD at low temperatures.

As the resistance heating element buried inside the substrate 6, it is proper to use tungsten molybdenum, platinum or the like which has a high melting point and excellent adhesion to $Si_3N_4$. Since a lead wire 8 is exposed to the gas under vacuum, it is necessary to keep the contact between the lead wire 8 and the heater 1 at as low temperature as possible. Corrosion resistance can be improved by applying such a CVD coating onto the leading portion including the lead wire 8.

In order to confirm the effects of the present invention, the following experiment was conducted.

A discoidal substrate 6 having a resistance heating element 7 made of tungsten buried thereinto was prepared from a $Si_3N_4$ raw material containing a sintering aid of yttria and alumina. The resistance heating element had a wire diameter of 0.4 mm and a total length of 2.5 m, and was wound in a spiral fashion having a diameter of 4 mm. As a wire terminal constituting the lead wire 8, a tungsten wire having a diameter of 2 mm was used. The lead portions 8 were taken out from the chamber through terminal ends 8a. In the heater 1, the resistance heating element 7 was buried over the entire discoidal substrate 6 as shown in FIG. 3, and the upper surface of the substrate 6 was smoothly and flat ground with a diamond grinding stone. Further, a $Si_3N_4$ film having high purity was formed on the surface of the substrate at a thickness of 0.2 $\mu$m at 1,600° C. by hot CVD.

While the wire terminal on the outer peripheral side of the heater was earthed, voltage was applied to the wire terminal on the central side from a heater power source (not shown). Further, voltage was suppressed to a low level to prevent discharging in vacuum. Thus, the heater adopted an electric power source control system using a thyristor.

This heater was fitted to a chamber 2 as shown in FIG. 2, and a test was effected for heating wafers in vacuum. The test revealed that the temperature of the substrate fell within a temperature range of 1,100° C. ±2% with respect to a 150 mm diameter portion of the substrate having the diameter of 180 mm. This confirmed that a 6 inch diameter wafer chucked could be uniformly heated. It was also confirmed that although a corrosive depositing gas was introduced into the chamber 2, neither particles nor sodium occurred at all. Particularly, although sodium was measured by a detector for the system after the surface of the substrate 6 was etched in an order of 1,000 Å, a result was less than a background value.

The construction of the heater according to the first aspect of the present invention may be applied to a wafer heater for an etching apparatus as it is.

As mentioned above, since the resistance heating element is buried in the substrate made of dense ceramic, no particles occur even upon exposure of the heater to the depositing gas. Particularly, the heater having the surface coated with the ceramic film by CVD exhibits excellent performance. Further, since the heater according to the present invention can be installed directly inside the chamber to heat the wafer, the heater can more rapidly heat the wafer at a higher heat efficiency as compared with the conventional indirectly heating type. In addition, since that surface of the heater upon which the wafer is to be placed is designed as a flat surface, the reaction gas will not enter the rear surface of the wafer, so that the intended surface of the wafer can be accurately treated by CVD or etching.

Therefore, the present invention greatly contributes to industrial development as the wafer heater for the semiconductor-producing apparatus involving the plasma CVD by solving the problems of the prior art.

The second aspect of the present invention will be explained with reference to embodiments shown in FIGS. 4 and 5. In these embodiments, the same reference numerals as in FIGS. 2, 3A and 3B are given to same or similar portions in FIGS. 4 and 5, and explanation thereof is omitted.

A reference numeral 12 denotes a hollow sheath inserted into a chamber 2 through a flange 9. The hollow sheath is made of molybdenum or tungsten. As shown, the lower end of the hollow sheath is thinned to reduce heat dissipation through heat transmission, and joined to an inorganic substrate 6 of a heater 1 with a cementing medium 13 composed of glass. An upper end of the hollow sheath 12 extends outside the chamber 2 through an opening 15 formed in the flange 9, so that the interior of the hollow sheath 12 may be kept at a given pressure without being influenced by change in the internal pressure of the chamber 2. A thermocouple 14 provided with a stainless steel sheath is inserted into the hollow sheath 12. A lid 17 is fitted around the upper end portion of the hollow sheath 12, and O-rings 16 are provided among the hollow sheath 12, the lid 17 and the flange 9 to prevent invasion of open air into the chamber 2.

In this embodiment, the hollow sheath 12 is joined to the inorganic substrate 6 in a void-free state by the steps of forming a sheath-fitting hole in the inorganic substrate 6 of the heater 1, inserting the tip of the hollow sheath 12 made of, for example, molybdenum into the fitting hole, filling, for example, a glass powder into the hole, and melting the glass powder at high temperatures (1,100° to 1,800° C.) lower than a firing temperature for the material, for example, silicon nitride constituting the substrate 6. As mentioned above, when the hollow sheath 12 is made of $Si_3N_4$, $Al_2O_3$ molybdenum, tungsten or an alloy composed mainly of these elements, the thermal expansion is made substantially equal among the heater 1, the hollow sheath 12 and the cementing medium 13 to prevent occurrence of cracks. Since the heat capacity of the hollow sheath should be made as small as possible to accurately measure the temperature of the inorganic substrate 6 with excellent followability of changes in temperatures of the substrate 6, the sheath preferably has a shape with a small thickness of not more than 1 mm and a small diameter of 5 mm. For example, it may be that the outer diameter and the thickness of the tip of the sheath are 2 mm and 0.4 mm, respectively, and the tip is cemented into the hole having a diameter of 3 mm and a depth of 13 mm with glass. The non-cemented portion of the sheath is designed to have a large diameter (for example, 6 mm) in view of sealingness between the sheath and the chamber 2 and workability of the sheath. The thicker diameter portion of the hollow sheath is sealed to the lid 17 with the O-ring 16.

As the material of the hollow sheath 12, molybdenum added with cerium oxide is preferred, which is a material which ensures the machining of a small diameter hole and does not become brittle by heating for joining at 1,100° to 1,800° C. An alloy such as stainless steel, Hastelloy or Incoloy may be used, when no problem occurs with respect to the joinability, the workability, and brittlement.

Figure 4:
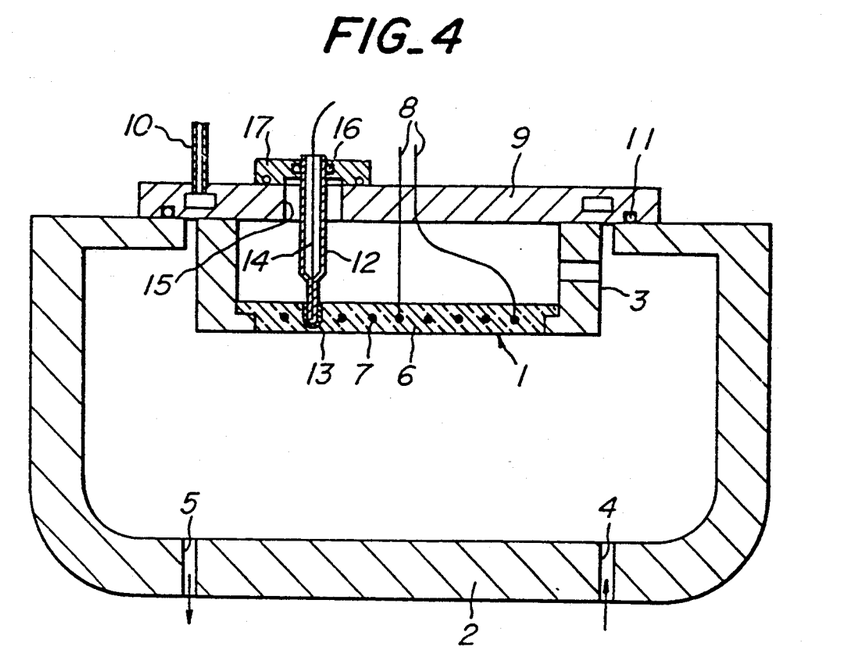
FIG. 4 is a sectional view of a first embodiment of the heating unit according to the second aspect of the present invention.

In the embodiment shown in FIG. 4, the hollow sheath 12 is inserted into the chamber 2 through its wall. However, as in an embodiment of FIG. 5, a hollow sheath 12 having an upper end sealed may be sealingly inserted inside a chamber 2. By sealing the upper end of the sheath, the interior of the sheath is maintained at a constant pressure without being influenced by changes in the internal pressure of the chamber 2. In this case, a lead wire 18 for a thermocouple 14 is taken outside the chamber 2, while being sealed with O-rings 16 and lead wire 18. Since the interior of the hollow sheath 12 is sealed in the embodiment of FIG. 5, although the interior of the chamber 2 undergoes changes in pressure due to elevation of temperature with the heater, the pressure inside the hollow sheath 12 does not substantially change even when gas enters the chamber 2.

The thus constituted heating unit is used for treating wafers placed on the lower face of the heater 1 by means of pins (not shown) in the chamber 2 under heating in vacuum by thermal CVD in the same manner as in the conventional heating unit.

However, in the second aspect of the present invention, the tip of the hollow sheath of which the interior is kept to undergo substantially no influence even with changes in the internal pressure of the chamber 2 is joined to the inorganic substrate 6 of the heater 1, and the thermocouple, 14 is inserted into the hollow sheath. Thus, the atmosphere surrounding the thermocouple 14 is maintained at a constant pressure without being influenced by changes in the internal pressure of the chamber 2. Owing to this, even if the pressure of the interior of the chamber 2 is reduced to a high vacuum degree, the behavior of the gas molecules around the thermocouple 14 does not change so that the temperature can always stably be detected. Therefore, the heating unit can accurately control the temperature of the heater 1 at a high vacuum degree.

Further, since the thermocouple is merely placed in the chamber together with the heater in the case of the conventional heating unit, there is a problem in that exchanging is not easy. However, as in the case of the embodiment in FIG. 4, when the thermocouple 14 is provided inside the hollow sheath 12 penetrating the wall of the chamber 2, the thermocouple 14 only can easily be exchanged without degrading the sealingness of the chamber 2.

Although air may be introduced into the interior of the hollow sheath 12 at atmospheric pressure, it is possible to fill the interior of the sheath with a reducing atmosphere to prevent oxidation of the interior. By so doing, the heating unit can easily raise the temperature up to around 1,100° C.

Figure 5:
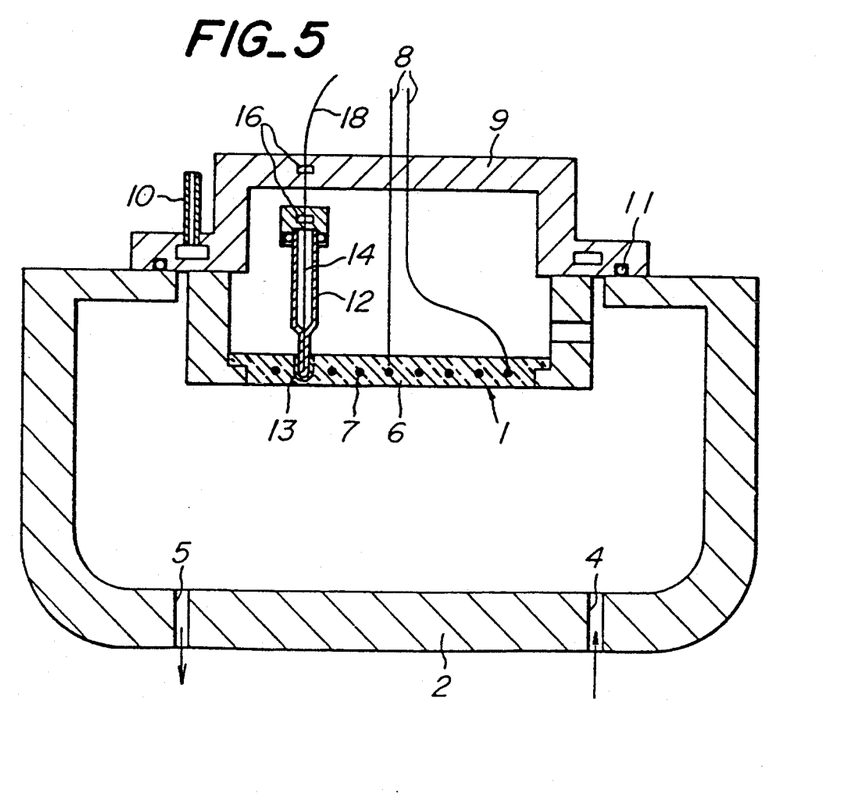
FIG. 5 is a sectional view of a second embodiment of the heating unit according to the second aspect of the present invention.

Both of the above embodiments shown in FIGS. 4 and 5 are constituted such that the inorganic substrate 6 of which temperature is to be measured constitutes the heater 1, but the object to be temperature-measured is not limited thereto. The heating unit can be applied to ordinary inorganic substrates.

As having been explained above, the heating unit according to the second aspect of the present invention is free from fears of erroneous operation of the thermocouple even at an high vacuum degree, and the temperature of the inorganic substrate inside the chamber can be accurately detected without being influenced by changes in the inner pressure of the chamber. Further, according to the heating unit of the second aspect of the present invention, the temperature of the heater can accurately be controlled. Furthermore, according to the heating unit of the second aspect of the present invention, the thermocouple can easily be exchanged.

Therefore, the present invention can greatly contribute to industrial developments as the heating unit for sweeping off the problems possessed by the prior art.

The third aspect of the present invention will be explained below with reference to embodiments shown in FIGS. 6 through 9.

Figure 6:
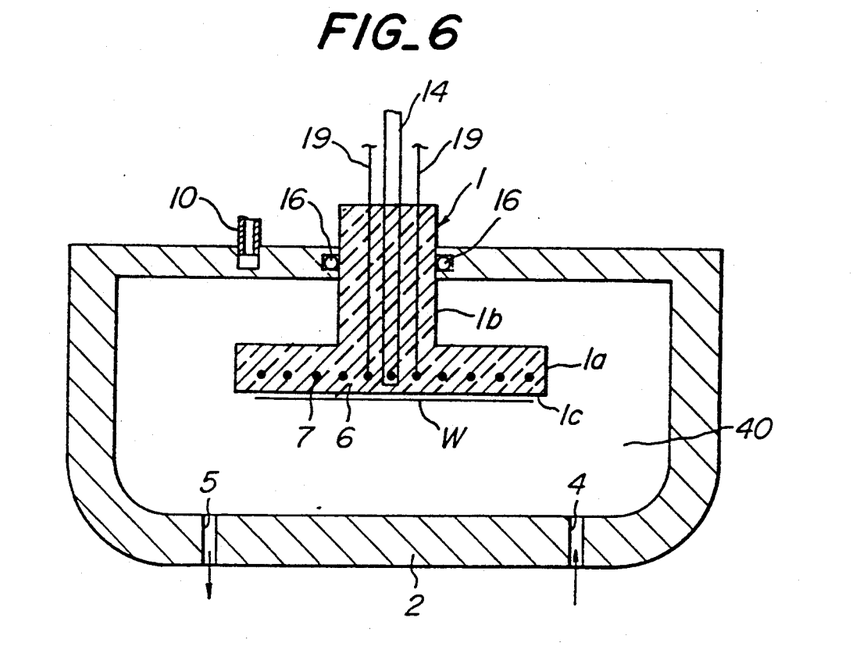
FIGS. 6, 7, 8 and 9 are schematically sectional views of illustrating semiconductor wafer heaters according to the third aspect of the present invention each attached to a chamber, respectively.

FIG. 6 is a sectional view illustrating the state in which, a heater according to the third aspect of the present invention is attached to a CVD apparatus for the production of semiconductors. Same reference numerals are given to same or similar parts as in FIGS. 2, 3A and 3B, and thus explanation thereof is omitted.

The heater 1 involves a discoidal heating portion 1a and a columnar support portion 1b which are integrated in a T-letter shaped section. The heating portion 1a and support portion 1b are made of a dense and gas-tight ceramic material. A heating element 7 made of a tungsten or molybdenum base material is buried in the dense and gas-tight ceramic in a spiral form. Electric power is applied to opposite ends of the heating element through lead wires 19 and 19, so that a wafer-heating surface 1c is heated up to, for example, around 1,100° C. The size of wafers currently used is 4 to 8 inches, so that the wafer-heating surface 1c is designed to have an area sufficient for heating the entire wafer W. The lead wire 19 may be a solid electrode to which a lead wire is connected at one exposed end and which is connected to the heating element at the other end.

As mentioned above, the columnar support portion 1b is integrated to the upper side of the discoidal heating portion 1a, and the outer peripheral surface of the columnar support portion 1b is gas-tightly sealed relative to the chamber 2 with an O-ring 15. In FIG. 6, a reference numeral 10 denotes a water-cooling jacket. A thermocouple 14 and two lead wires 19 are buried in the discoidal heating portion and the columnar support portion 1b, and are taken outside the chamber 2 through an upper end face of the columnar support portion 1b.

This embodiment of the heater can solve the contamination occurred in the conventional metallic heater and the deterioration in the heat efficiency of the indirectly heating type.

In addition, since the lead wires 19 are buried in the support portion 1b without being exposed to an inner space 40 of the chamber 2, there is no fear in that the lead wires 19 are corroded, the interior of the chamber is contaminated through the lead wires, and discharging or leakage occurs in vacuum between the lead wires and between the lead wires and the chamber. Therefore, no special sealing structure is necessary to seal the lead wires or electrodes 19. Further, a high melting point metal can be used other than tungsten as a material for the lead wire or electrode.

The thermocouple 14 is also buried in the support portion 1b, and is not exposed to the space 40 inside the chamber 2. Therefore, no special sealing structure is necessary for sealing the thermocouple, resulting in a very large advantage. That is, according to the inventors' researches, as mentioned before, with respect to vacuum, the gas molecules around the thermocouple behaves as a viscous stream in the vacuum state of atmospheric pressure to 1 torr, while the viscous stream is converted to the molecule stream as the vacuum degree becomes higher. It is known that with this, since the way of the heat transfer greatly changes in the vicinity of the thermocouple, the temperature cannot be accurately measured. It is also known that when the pressure greatly varies even in the viscous stream zone, errors occur in the measurement of the temperature with respect to the measurement results. However, since the thermocouple is extended outside the chamber without being exposed to the space 40 of the chamber 2, the above problem of the errors on measurement of temperature does not occur.

Further, since the heating portion 1a is supported by gas-tightly sealing the columnar support portion 1b relative to the chamber 2, no special supporting member is necessary for supporting the heating portion 3. Therefore, the surface area of the entire heater can be reduced, so that the amount of the gas absorbed thereinto is small. This is advantageous for the semiconductor-producing apparatus utilizing high vacuum, because the gas absorbed into the surface of the heater needs to be discharged under high vacuum.

Furthermore, according to the inventors' investigation, when a peripheral surface of the discoidal heater is supported by a cover made of graphite, heat escapes through the peripheral surface so that it is difficult to uniformly heat the outer peripheral portion and the inner peripheral portion of the discoidal heater. To the contrary, according to the embodiment of the third aspect of the present invention, since heat does not escape through the peripheral surface, the heating surface 1c can be easily uniformly heated.

As the material for the discoidal heating portion 1a, silicon nitride, sialon or aluminum nitride is preferred, and silicon nitride or sialon is more preferable from the standpoint of thermal shock resistance. The discoidal support portion 1b is preferably made of the same material as that of the heating portion 1a from the standpoint of integral sintering mentioned later. However, it is convenient to use at least dense ceramic, because of its low change of contamination.

The heater 1 may be produced by integrally shaping a ceramic material to form a heating portion 1a and a support portion 1b in which lead wires 19 and a thermocouple 14 are preliminarily buried, and integrally sintering the heating portion and the support portion by hot isostatic pressing.

The sealing between the chamber 2 and the support portion 1b can be effected by an O-ring shown in FIG. 5 or by diffusion bonding or friction bonding, or by forming a metallic film on the surface of the support member by sputtering, followed by the friction press bonding, glass bonding or metal packing.

It is preferable that the wafer-heating surface 1c is designed to have a flat surface. Particularly, when the wafer W is directly placed on the wafer-heating surface 1c, it is necessary to prevent the invasion of the depositing gas under the rear surface of the wafer W contacting the heating portion 1c by setting the flatness degree of the heating surface to not more than 500 $\mu$m.

As the resistance heating element 7 buried in the heating portion 1a, tungsten, molybdenum or platinum is preferably used, which has a high melting point and excellent adhesion relative to $Si_3N_4$ or the like.

Figure 7:
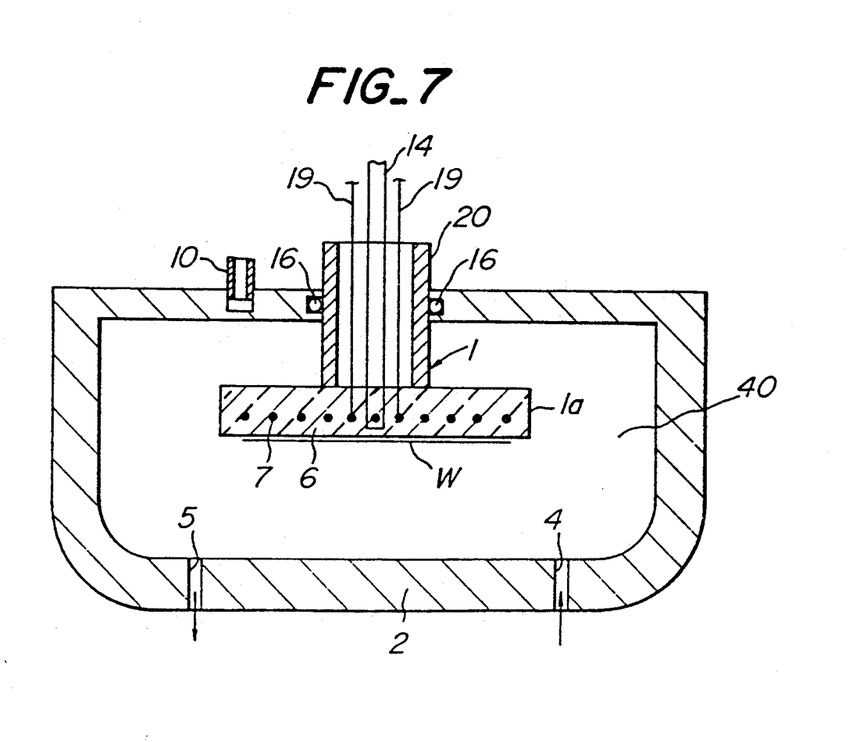

In a heater 1 shown in FIG. 7, a cylindrical hollow support portion 20 is joined integrally to a discoidal heating portion 1a instead of the columnar support portion 1a, and the columnar support portion 20 is gas-tightly sealed to the chamber 2. End portions of lead wires 7 and a thermocouple 14 are buried in the discoidal heating portion 1a, and taken out into a cylindrical space inside the columnar support portion 20. The heater according to this embodiment exhibits the same effects as in FIG. 6. The lead wire may be a rigid electrode which is connected to a lead wire at one exposed end and a heating element 7 at the other buried portion, respectively.

In order to produce the heater 1, not only the hot isostatic press can be used, but also the following processes may be favorably used.

(1) A heating portion 1a in which lead wires 19 and a thermocouple 14 are preliminarily buried on shaping is pressurelessly sintered or sintered by hot pressing. A cylindrical support portion 20 is produced by injection molding, extrusion molding, press molding or isostatic pressing, and pressureless sintering the shaped body. Then, the sintered heating portion and the sintered cylindrical support portion are gas-tightly joined with glass.

(2) Shaped bodies for the heating portion and the cylindrical support portion are independently formed by extrusion, injection, pressing or isostatic pressing, and they are fitted to each other with a dimensional allowance of 1/100 to 10 mm, followed by pressureless sintering, or by pressing the cylindrical support shaped body to the heating portion shaped body under sufficient pressure, followed by sintering under pressure.

(3) The heating portion 1a is sintered in the same way in (1), a cylindrical support portion 20 is formed from a metal or a metallic compound, and they are gas-tightly bonded with glass.

As a material for the cylindrical support portion 20, not only ceramic but also a metal or a metallic compound may be used. It is advantageous to use a dense ceramic as the material for the cylindrical support portion, because of less contamination. Further, as the metal, it is preferable to use a material which does not result in contamination of the semiconductor wafer W. More concretely, it is preferable that tungsten, molybdenum, tantabum or titanium capable of being used at high temperatures is used for a portion near the heating portion 1a, while stainless steel or aluminum is used for a low temperature portion near the O-ring 16.

Figure 8:
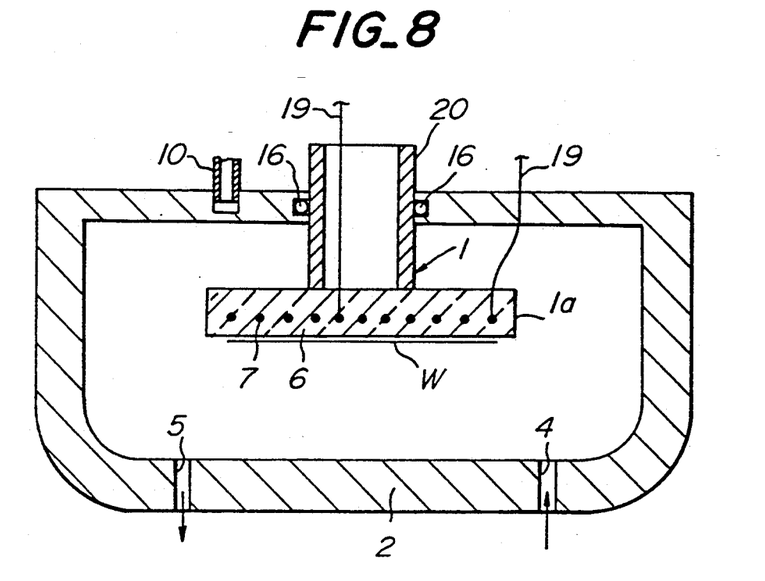

FIG. 8 is a sectional view of a modification of the embodiment shown in FIG. 7. The difference between FIGS. 7 and 8 is merely that one of the lead wires 19 is taken out from the chamber through the inner space 40. It is considered that the embodiment in FIG. 8 will not cause any great practiced problem when in use.

Figure 9:
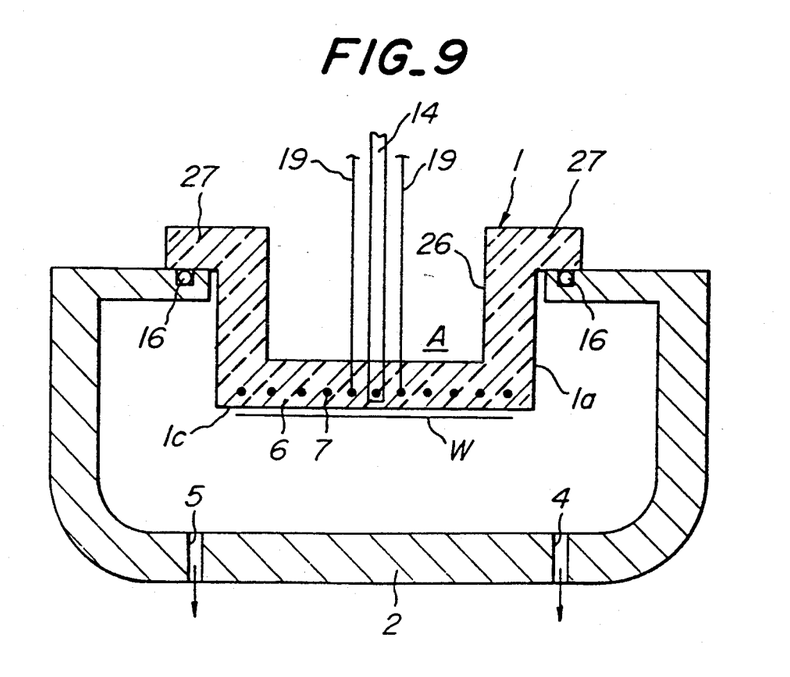

FIG. 9 is a sectional view showing a further embodiment of the third aspect of the present invention.

In this embodiment, a cylindrical support portion 26 is provided on a peripheral portion of a discoidal heater 1a. The support portion 26 has a peripheral inverted L-letter wall section, and a horizontally extending portion 27 which is gas-tightly sealed relative to the chamber 2. This embodiment has the following advantages.

(1) When the heater is fixed to the chamber in FIGS. 6 and 7, the support portion is held by the chamber 2. Therefore, stress concentration is apt to occur in the integrated portion between the discoidal heating portion 1a and the columnar support portion 1b of the heater 1 in FIG. 6 or in the joined portion between the heating portion 1a and the columnar support portion 1b of the heater 1 in FIG. 7, which may result in danger of breakage. On the other hand, since the heater 1 in FIG. 9 possesses the support portion 26 having the L-letter shaped wall section at the peripheral portion of the discoidal heating portion 1a, the holding area is great to dissipate stresses so that the integrated portion or the joined portion is difficult to break.

(2) In the thermal CVD process or the like, a CVD film is attached, after deposition, to that surface of the heater which corresponds to a portion excluding the wafer W. When the deposited film is to be cleaned off with plasma, a plasma electrode can be arranged in a portion A on the recessed face of the heater, so that the electrode is not exposed to the gas atmosphere inside the chamber 2.

(3) When a cooling structure is fitted to the portion A of the recessed face, response on cooling can be improved.

(4) When a heat-interrupting or cooling means is provided to meet the temperature distribution at a chucked surface of the wafer W on the heating portion 1a, the temperature distribution on the chucked surface of the wafer W can be controlled.

With respect to the corrosion of the lead wire 19 and the contamination of the semiconductor wafer W, excellent results can be obtained similarly in the case of the heaters 1 of FIGS. 7 and 9 mentioned above.

In order to produce the heater 1, not only the hot isostatic press but also the above-mentioned processes (1) through (3) may be used.

Since the temperature of the peripheral portion of the heating surface is lower than that of the central portion of the heating surface in the case of the of the heaters of FIGS. 6 and 7, the heat-transmitting surface can be controlled by varying the diameter of the support portion 1b to realize the improved uniformity of the heating surface. Thus, the wafer-heating surface can be more uniformly heated.

Since the heater 1 in FIG. 8 has the support portion 26 having the inverted L-letter shaped wall section on the peripheral portion of the discoidal heating portion 1a, the amount of heat dissipated through the peripheral portion of the heating surface is greater than heat transmission through the support portion 26. Therefore, in the embodiment of FIG. 8, a heating element having a greater amount of heat generation at a peripheral portion is buried in the heating portion 1a.

In the embodiments according to the third aspect of the present invention, a temperature-measuring device, for example, a radiation thermometer other than the thermocouple may be used. Further, in these embodiments, the wafer-heating surface is directed downwardly, and the wafer is treated while it is supported from the under side by pins not shown. The wafer-heating surface may be directed upwardly.

Although the projecting support portion is sealed relative to the wall face of the chamber on the ceiling side in the above embodiments, the fitting posture is not limited thereto. It can be fitted to the wall face or the side wall in the lower portion of the chamber.

Further, in the above embodiments, the projecting support portion is provided on the back face of the heating portion on the opposite side of the wafer-heating surface. The projecting support portion may be provided on the peripheral surface of the discoidal heating portion. The shape of the heating portion is preferably discoidal for, uniformly heating the circular wafer, but other shapes such as a rectangular shape or hexagonal shape may be employed.

The third aspect of the present invention may also be applied to plasma etching apparatus or photoetching apparatus.

According to the semiconductor heater and the production thereof in the third and fourth aspects of the present invention, since the heating portion is arranged inside the chamber to directly heat the wafer, the heating efficiency is high. Further, since the heating portion is made of ceramic in which the resistance heating element is buried, no contamination occurs unlike the metallic heater.

In addition, since the lead wires or electrodes connected to the resistance heating element are not substantially exposed to the inner space of the chamber, the lead wires or electrodes are free from the corrosion or the inner space does not suffer contamination from the lead wires or the electrodes. Therefore, no special sealing structure is necessary for sealing the lead wires or electrodes, and a high melting point metal other than tungsten may be used as the material for the lead wires or electrodes.

Further, since the gas-tight seal is formed between the projecting support portion and the chamber, no special member is necessary for supporting the heating portion. Therefore, the entire heater can be simplified, and the surface area can be reduced. Accordingly, the amount of gas absorbed by the heater can be decreased, which is advantageous for the semiconductor producing apparatus utilizing high vacuum degree.

What is claimed is:

1. A wafer heater for use in a gas-containing chamber of a semiconductor-producing apparatus, said heater comprising a discoidal substrate made of a substantially gas-tight, unitary sintered ceramic, and a resistance heating element buried in and integrally bonded to said substrate, wherein that surface of the substrate upon which a wafer is to be place is a flat surface, and said resistance heating element is sealed from communication with the gas.

2. The wafer heater according to claim 1, wherein a ceramic film is formed, by chemical vapor deposition or thermal chemical vapor deposition, on that surface of the substrate which is to contact the gas inside the chamber of said semiconductor-producing apparatus.

3. The wafer heater according to claim 2, wherein the substrate is composed mainly of $Si_3N_4$.

4. The wafer heater according to claim 1, wherein the substrate is composed mainly of $Si_3N_4$.

5. The wafer heater according to claim 1, wherein the resistance heating element is composed of a material selected from the group consisting of tungsten, molybdenum and platinum.

6. The heater according to claim 1, wherein the semiconductor-producing apparatus includes a vessel defining a chamber and said heater further comprises a projecting support portion provided on a surface of the substrate other than that surface upon which the wafer is to be placed for heating, and lead wires connected to the resistance heating element, wherein when the heater is placed in an opening of the vessel, the projecting support portion forms a gas-tight seal between the chamber and an exterior of the vessel, and the lead wires are taken out from the chamber such that at least the lead wires are not substantially exposed to an inner space of the chamber.

7. The heater according to claim 6, wherein one end of a thermocouple is buried in the substrate, and the other end is taken out from the chamber such that the lead wire of the thermocouple is not substantially exposed to an inner space of the chamber.

8. The heater according to claim 7, wherein said projecting support portion is composed of a ceramic.

9. The heater according to claim 7, wherein the projecting support portion is composed of a metal or a metal compound, and is bonded to that surface of the substrate which is other than the surface of the heater upon which the wafer is to be placed.

10. The heater according to claim 8, wherein said projecting support portion is composed of a ceramic.

11. The heater according to claim 8, wherein the projecting support portion is composed of a metal or a metal compound, and is bonded to that surface of the substrate which is other than the surface of the heater upon which the wafer is to be placed.

12. The heater according to claim 1, wherein said substrate has a wafer absorption of not more than 0.01%.

13. The heater according to claim 1, wherein the surface of said substrate has a flatness of not greater than 500 microns.

* * * * *